United States Patent [19]
Nakamura et al.

[11] Patent Number: 6,096,631
[45] Date of Patent: Aug. 1, 2000

[54] METHOD OF MANUFACTURING SEMICONDUCTOR DEVICE

[75] Inventors: Kenro Nakamura; Rempei Nakata, both of Kamakura; Yusuke Kohyama; Nobuo Hayasaka, both of Yokosuka, all of Japan

[73] Assignee: Kabushiki Kaisha Toshiba, Kawasaki, Japan

[21] Appl. No.: 09/081,010

[22] Filed: May 19, 1998

[30] Foreign Application Priority Data

May 20, 1997 [JP] Japan ................................. 9-129596

[51] Int. Cl.⁷ ..................................................... H01L 21/44
[52] U.S. Cl. .......................... 438/597; 438/643; 438/637; 438/640; 438/652; 438/666; 438/669
[58] Field of Search .................................... 438/643, 637, 438/640, 652, 669, 666, 597

[56] References Cited

U.S. PATENT DOCUMENTS

| | | | |
|---|---|---|---|
| 5,604,158 | 2/1997 | Cadien et al. | 437/200 |
| 5,866,920 | 2/1999 | Matsumoto et al. | 257/63 |
| 5,874,756 | 2/1999 | Ema et al. | 257/296 |
| 5,904,558 | 5/1999 | Suzuki | 438/633 |
| 5,904,561 | 5/1999 | Tseng | 438/643 |

*Primary Examiner*—John F. Niebling
*Assistant Examiner*—Lynne Gurley
*Attorney, Agent, or Firm*—Finnegan, Henderson, Farabow, Garrett & Dunner, L.L.P.

[57] ABSTRACT

The present invention provides a method of manufacturing a semiconductor device, including the steps of forming a first film on an entire surface of a substrate having a recessed portion, including a bottom surface and a side wall of the recessed portion, without completely filling the recessed portion, forming a second film on an entire surface of the first film such that the recessed portion, on the bottom surface and the side wall of which the first film is formed, is completely filled, and polishing the first and second films by a chemical-mechanical polishing method such that the substrate is exposed and the first and second films in the recessed portion remain.

22 Claims, 2 Drawing Sheets

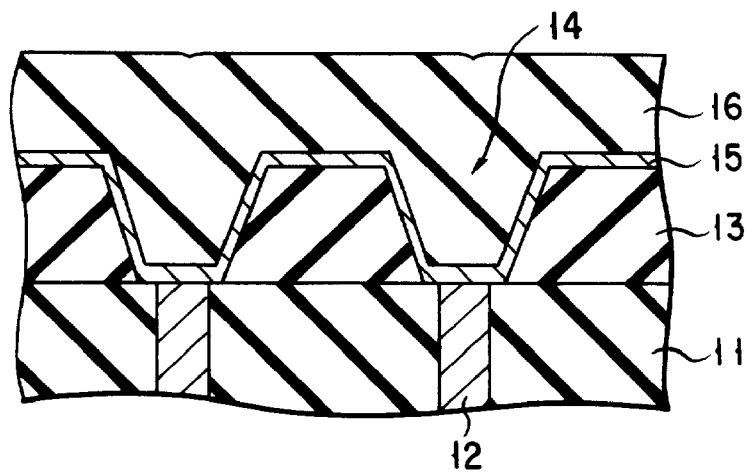
F I G. 1A
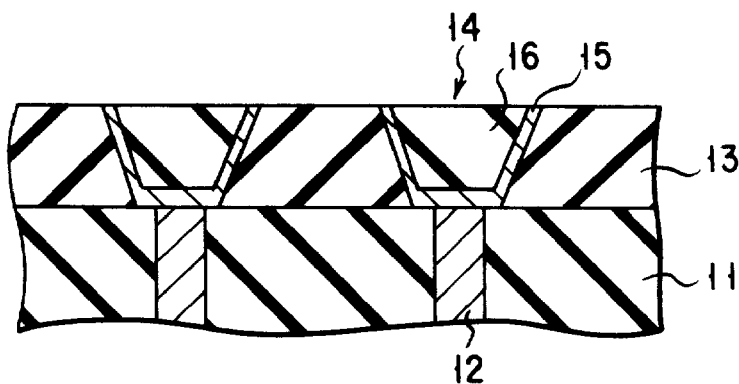
F I G. 1B
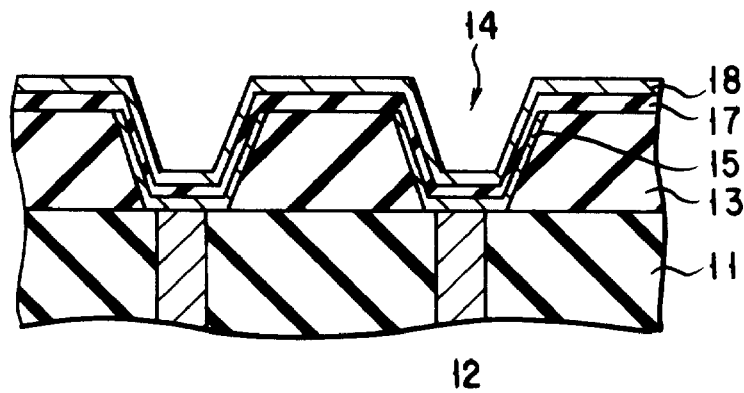
F I G. 1C

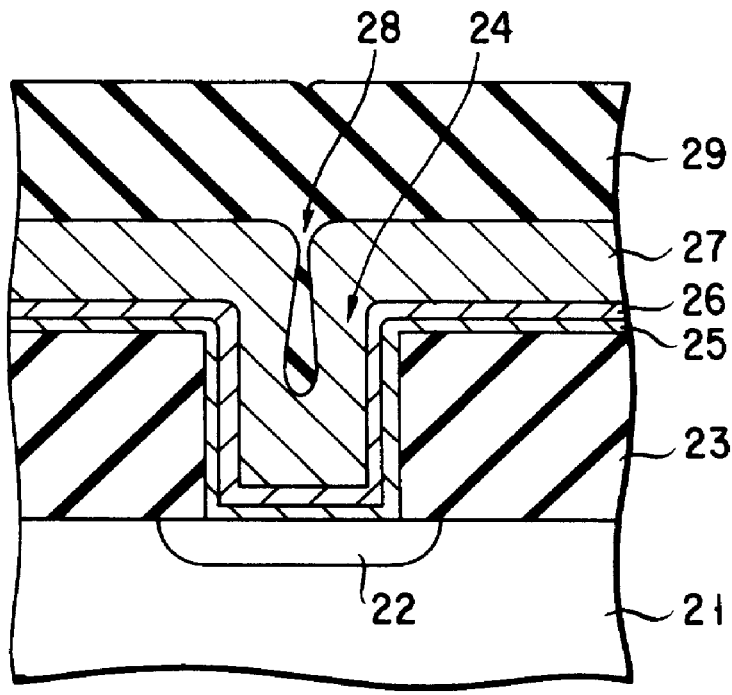
F I G. 2A
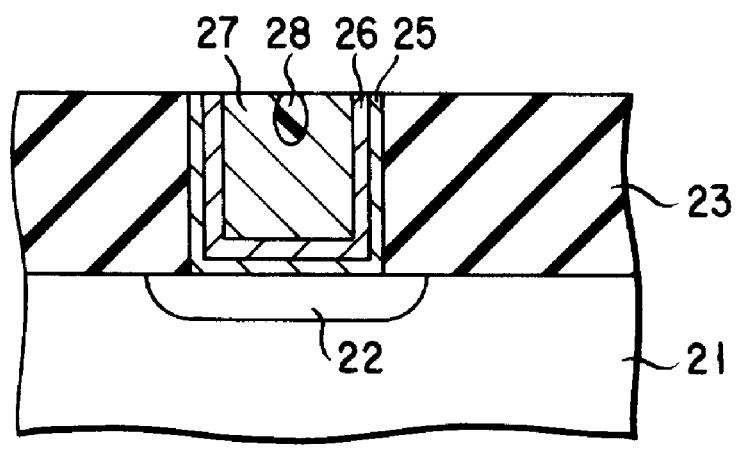
F I G. 2B

METHOD OF MANUFACTURING SEMICONDUCTOR DEVICE

BACKGROUND OF THE INVENTION

The present invention relates to a method of manufacturing a semiconductor device, and more specifically to a method of manufacturing a semiconductor device, which uses a chemical-mechanical polishing (to be called simply CMP hereinafter) technique.

Recently, as the density of semiconductor device is increased and the size thereof is reduced, various types of micromachining techniques are being researched and developed. The CMP technique is one of these micromachining technique, and is essential for the smoothing of interlayer insulation films, the formation of plugs and embeded metal wires, and the formation of embeded element separation regions.

Usually, the CMP method is used to smooth an uneven surface; however the method can be applied to other usage. For example, with the CMP method, it becomes possible to form a metal film selectively on the bottom surface and side walls of a recessed portion of a substrate, into a shape corresponding to that of the recessed portion.

More specifically, a metal film is formed on a substrate having a recessed portion, in a shape which reflects the configuration of its surface. Then, the surface of the substrate on which the metal film is formed, is polished by the CMP method. The polishing process is stopped when the entire portion of the metal film formed on the substrate, except for that remaining in the recessed portion, is removed. In this manner, the metal film is formed selectively only on the bottom surface and side walls of the recessed portion.

However, in the case where the CMP method is applied to the above-described usage, the following problem occurs. That is, with the above-described method, the surface of the substrate, subjected to CMP is not completely smooth, but some recessed portions still remain. As a result, dusts such as polisher used for the CMP and fine particles created by the CMP adhere to the bottom surfaces and side walls of the recessed portions, or fill the recessed portions, while polishing the metal film formed on the surface of the substrate.

In the case where the next step is started in this status, the reliability and yield of the element are naturally decreased. In order to avoid this, the dust should be eliminated after the CMP is finished. However, in the case where, particularly, the opening diameters of the recessed portions are in the order of sub-microns, it is very difficult to completely remove the dust even if the washing is performed after finishing the CMP.

BRIEF SUMMARY OF THE INVENTION

An object of the present invention is to provide a method of manufacturing a semiconductor device, capable of preventing dusts from adhering to the bottom surface and side walls of a recessed portion, and from filling the recessed portion, when forming a thin film on the surface of a substrate selectively with regard to the bottom surface and side walls of the recessed portion, and into a shape corresponding to the shape of the recessed portion.

Another object of the present invention is to provide a method of manufacturing a semiconductor device, capable of improving the reliability and yield of devices.

According to an aspect of the present invention, there is provided a method of manufacturing a semiconductor device, including the steps of: forming a first film on an entire surface of a substrate having a recessed portion, including a bottom surface and a side wall of the recessed portion, without completely filling the recessed portion; forming a second film on an entire surface of the first film such that the recessed portion, on the bottom surface and the side wall of which the first film is formed, is completely filled; and polishing the first and second films by a chemical-mechanical polishing method such that the substrate is exposed and the first and second films in the recessed portion remain.

According to another aspect of the present invention, there is provided a method of manufacturing a semiconductor device, including the steps of: forming a recessed portion in one of main surfaces of a substrate; forming a metal film on an entire surface of the substrate having the recessed portion, including a bottom surface and a side wall of the recessed portion, without completely filling the recessed portion with the metal film, thus forming a seam portion in an upper section of the recessed portion; forming a thin film on an entire surface of the metal film such that the recessed portion, on the bottom surface and the side wall of which the metal film is formed, is completely filled; and polishing the metal film and the thin film by a chemical-mechanical polishing method such that the substrate is exposed and the metal film and the thin film in the recessed portion remain.

According to still another aspect of the present invention, there is provided a method of manufacturing a semiconductor device, including the steps of: forming a recessed portion in one of main surfaces of a substrate; forming a first metal film on an entire surface of the substrate having the recessed portion, including a bottom surface and a side wall of the recessed portion, without completely filling the recessed portion with the metal film; forming a thin film on an entire surface of the first metal film such that the recessed portion, on the bottom surface and the side wall of which the metal film is formed, is completely filled; polishing the first metal film and the thin film by a chemical-mechanical polishing method such that the substrate is exposed and the first metal film and the thin film in the recessed portion remain; removing the thin film remaining in the recessed portion; forming a dielectric film on the first metal film in the recessed portion; and forming a second metal film on the dielectric film such that the second metal film is electrically insulated from the first metal film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1C are cross sectional views schematically showing the steps of manufacturing a semiconductor device, according to the first embodiment of the present invention; and FIGS. 2A and 2B are cross sectional views schematically showing the steps of manufacturing a semiconductor device, according to the second embodiment of the present invention.

DETAILED DESCRIPTION OF THE INVENTION

The present invention will now be described in more detail.

First, the first embodiment of the present invention will now be described with reference to FIGS. 1A to 1C. In the first embodiment, the present invention is applied to the formation of the capacitor of a DRAM.

FIGS. 1A to 1C show the steps of manufacturing a semiconductor device, according to the first embodiment of the present invention. FIGS. 1A to 1C are all cross sectional views.

In order to form a capacitor portion of a DRAM, first, a plug 12 is embedded in an insulating film formed on a silicon substance (not shown) as shown in FIG. 1A. An $SiO_2$ 13 film is formed on the insulating film in which the plug 12 is embedded, to have a thickness of about 300 nm by a plasma CVD method using TEOS. Next, a section of the $SiO_2$ film 13, which is located above the plug, is removed to make a hole 14 in the $SiO_2$ film 13. The hole 14 is made to have, for example, a bottom of a circular shape having a diameter of 200 nm. It is preferable that the hole 14 should be formed to have a tapered shape towards the bottom such that the side wall of the hole is inclined by an angle of about 10° with respect to the direction perpendicular to the surface of the substrate.

Subsequently, an Ru film 15 is formed on the $SiO_2$ film 13 in which a hole 14 is formed, to have a thickness of about 60 nm by a sputtering or CVD method, or the like. The Ru film 15 is used as a lower electrode of the capacitor.

Next, a film forming material such as SOG (Spin On Glass) or a resist is applied on the Ru film 15 by the spin coat method or the like, so as to form a thin film (capping film) 16. The capping film 16 is provided to prevent dusts from adhering to the side wall and bottom of the hole 14, and filling the hole 14 during the CMP step. Thus, it is necessary to form the capping film 16 such that the film forming material completely fill the hole 14. This is because dusts easily accumulate on the upper section within the hole 14 in the case where the hole is not completed filled with the film forming material. It is possible that the dusts adhere to the side wall and bottom surface of the hole while removing the portion of the film forming material remaining in the hole 14 after the CMP.

Further, it is preferable that the capping film 16 should be formed such that the surface thereof is made smooth. In the case where the hole 14 is completely filled with the film forming material, even if the surface portion of the capping film 16, which is located above the hole 14, has a recess, such a recess usually disappears gradually as the CMP progresses. However, if the CMP step is carried out when the depth of the recess is excessively large with respect to the thickness of the capping film 16, a recess is created in the film forming material remaining in the hole 14, and dusts may accumulate on the created recess.

In order to avoid this, it is preferable that the capping film 16 should be made to have a thickness of the order of micron, for example, 1 μm or more so as to obtain a flat surface. Further, it is further preferable that the formation of the capping film 16 should be made by an coating technique such as spin coat method, with which the hole 14 can be easily filled, and a film having a sufficient thickness can be easily formed.

After the capping film 16 is formed on the Ru film 15 as described above, the capping film 16 and Ru film 15 are polished by the CMP method as can be seen in FIG. 1B. It should be noted that the polishing rate of the $SiO_2$ film 13 is slower than those of the capping film 16 and the Ru film 15, therefore the polishing of these films can be stopped as soon as the $SiO_2$ film 13 serving as a stopper film is exposed. Thus, the film forming material 16 and the Ru film 15 are left within the hole 14. In reality, there are a plurality of Ru films 15 serving as lower electrodes, and they are electrically insulated from each other between cells.

In the polishing of the CMP method described above, a slurry made by dispersing alumina grains into water and adding an oxidizing agent, or the like, can be used. The polishing condition for the capping film 16 and that for the Ru film 15 may be the same or different from each other.

After that, the film forming material 16 remaining in the hole 14 is removed. An effective example of the method of removing the film forming material 16 is exposing the material to HF gas or the like in the case where the film forming material 16 is SOG. Or when the film forming material 16 is a resist, the film forming material 16 can be removed by immersing it into a resist peeling liquid or carrying out ashing on it.

Subsequently, as can be seen in FIG. 1C, a $BaSrTiO_3$ film 17 serving as a dielectric film of the capacitor is formed to have a thickness of about 60 nm on the Ru film 15 by the sputtering method, CVD method or the like. In the case where the $BaSrTiO_3$ film 17 thus formed is of an amorphous type, it is subjected to an annealing process so as to convert it into a polycrystal type having the perovskite type structure.

Next, An Ru film 18 is formed to have a thickness of 60 nm on the $BaSrTiO_3$ film 17 by the sputtering method, CVD method or the like. An interlayer insulation film (not shown) is formed on the Ru film 18. Further, a part of the interlayer insulation film is opened, and a plug (not shown) is made in the opening so as to make an electrical connection to the Ru film 18, thus forming a capacitor portion of a DRAM.

In the case where the capacitor portion for the above-described DRAM were manufactured without forming the capping film 16, the problem that dusts adhere to the side wall and bottom surface of the hole 14, or the hole 14 is filled with dusts, during the CMP step, would occur. Since the size of the hole 14 is very much small, it is very difficult to complete remove the dusts even if the washing is carried out after the CMP.

If the $BaSrTiO_3$ film 17 is formed without completely removing the dusts, a contact error easily occurs between the Ru film 15 and the $BaSrTiO_3$ film 17. Further, in this case, $BaSrTiO_3$ cannot easily grow on the dusts or in the vicinity thereof, the thickness of the $BaSrTiO_3$ film 17 is locally reduced. Thus, in the capacitor manufactured without completely removing the dusts, the leak current becomes large, and thus the operation of such a capacitor becomes unstable.

By contrast, according to the method of the first embodiment of the present invention, the hole 14 is filled with the film forming material 16 throughout the process of the CMP step, and therefore the dust cannot adhere to the bottom surface and side wall of the hole 14 or the hole 14 cannot be filled with the dusts. Therefore, the capacitor manufactured by the method according to the first embodiment of the present invention is free from the above-described problem of the prior art technique. To be specific, with the method of the first embodiment, it is possible to manufacture a embeded-type capacitor having a high reliability.

It should be noted here that the first embodiment is described in connection with the case where the lower electrode 15 is made of Ru; however RuO$_2$, Pt or SrRuO$_3$ can be also used. Further, for the upper electrode 18, materials such as W and WN can be used in addition to that used for the lower electrode 15. Furthermore, as the material for making the dielectric film 17, not only BaSrTiO$_3$ but also a general dielectric material used for capacitors can be used.

As the film forming material for making the capping film 16, not only SOG or resist, but also a polyimide or the like can be used. There is no particular limitation to the film forming material used for the capping film 16 as long as it satisfies the conditions such that the material is able to completely fill the hole 14, the polishing rate is appropriate, it does not peel off from the hole 14 while polishing, and it can be selectively removed without imparting any adverse effect on the substrate, insulating film or the like.

Further, in the first embodiment, the capping film 16 is formed by the coating method; however it is also possible to use the condensation CVD method or the like.

The second embodiment of the present invention will now be described with reference to FIGS. 2A and 2B. In the second embodiment, the present invention is applied to the formation of embedded bit lines of a DRAM.

FIGS. 2A and 2B show the steps of manufacturing a semiconductor device, according to the second embodiment of the present invention. FIGS. 2A and 2B are cross sectional views.

In order to form embedded bit lines of a DRAM, first, as can be seen in FIG. 2A, a diffusion layer 22 of a MOS transistor is formed in the surface region of a Si substrate 21. Then, an insulating film 23 is formed to have a thickness of about 500 nm, on the Si substrate 21. Further, the portion of the insulation film 23, which is located above the diffusion layer 22, is removed so as to form a groove 24 designed to make an electrical connection to the diffusion layer 22.

Subsequently, a Ti film 25 is formed to have a thickness of about 20 nm, on all the exposed surfaces of the insulation film 23, and on the exposed surface of the diffusion layer 22. Then, a TiN film 26 is formed to have a thickness of 40 nm, on the Ti film 25. The Ti film 25 and the TiN film 26 thus formed, both serve as barrier metals. It should be noted that the Ti films 25 and the TiN film 26 are formed on the surface of the Si substrate 21, on which the insulating film 23 is formed, so as to have shapes corresponding to the configuration of the surface.

Next, a W film 27 is formed on the TiN film 26 by the blanket CVD method, so as to fill the groove formed by the TiN film 26.

In the W film 27 thus formed, a seam portion 28 is formed by overhanging occurring at the upper section of the groove 24. The seam portion 28, in some cases, contains a cavity the upper section of which is opened. In such cases, a film forming material such as SOG (Spin On Glass) is applied on the W film 27 by the spin coat method or the like, so as to form a thin film (capping film) 29. Thus, the cavity made in the seam portion is filled with the film forming material.

It is required that the cavity is completely filled. However, the opening width of the cavity made in the seam portion 28 is very narrow, it is sometimes difficult to completely fill the cavity. In such a case, it is preferable that the formation of the capping film 29 should be carried out by applying a predetermined solution having a low viscosity. In the case where the capping film 29 is formed by applying a solution having a low viscosity, it becomes possible to substantially completely fill the cavity made in the seam portion 28. It should be noted that the viscosity of the solution can be adjusted by controlling the concentration of the solution, the type of solvent used, and the like.

Further, it is possible that the film forming material is fluidized by heating the capping film 29 after the film is formed. By making the capping film 29 reflow as descirbed, the cavity made in the seam portion 28 can be substantially completely filled with the film forming material. Further, in place of employing the coating method for forming the capping film 29, it is effective to use the condensation CVD method.

After filling the cavity made in the seam portion 28 with the film forming material by forming the capping film 29, the capping film 29, the W film 27, the TiN film 26 and the Ti film 25 are polished by the CMP method as can be seen in FIGS. 2B. The polishing is stopped as soon as the insulating film 23 serving as a stopper film is exposed. Thus, the portions of the Ti film 25, the TiN film 26, the W film 27 and the film forming material 28, which are located in the groove 24, remains without being polished. Thus, embedded bit lines are formed.

In the polishing according to the CMP method described above, a slurry prepared by dispersing alumina grains into water and adding an oxidizing agent, or the like, can be used. The portion of the film forming material 29, which remains in the groove 24 after the polishing, may be left or removed.

In the case where the above-described embedded bit lines were manufactured without forming the capping film 29, the problem that the cavity made in the seam portion 28 is filled with dusts or dusts adhere to the surface within the cavity, during the CMP step, would occur. It is very difficult to complete remove the dusts even if the washing is carried out after the CMP.

If the plug is connected onto a embeded bit line without completely removing the dusts, a gas is generated at the formation of the plug, and therefore the adhesion between the plug and bit line is deteriorated. Therefore, without using the capping film 29, a high reliability cannot be obtained.

By contrast, according to the method of the second embodiment of the present invention, the cavity made in the seam portion 28 is filled with the film forming material 29 throughout the process of the CMP step, and therefore the dust cannot adhere to the inner surface of the cavity or the cavity cannot be filled with the dusts. Therefore, the embeded bit lines manufactured by the method according to the second embodiment of the present invention are free from the above-described problem of the prior art technique. To be specific, with the method of the second embodiment, it is possible to manufacture embeded bit lines having a high reliability, without causing an increase in the contact resistance.

It should be noted here that the second embodiment is described in connection with the case where the embedded bit lines are made of W; however Al or the like can be also used. Further, the second embodiment is described in connection with the case where the present invention is applied to the formation of embedded bit lines; however the invention may be applied naturally to the formation of other embedded lines. Furthermore, the present invention is applicable to the filing of a via hole.

As the film forming material for making the capping film 16, not only SOG or resist, but also a resist, a polyimide or the like can be used. There is no particular limitation to the film forming material used for the capping film 29 as long as it satisfies the conditions such that the material is able to completely fill the cavity made in the seam portion 28, the polishing rate is appropriate, it does not peel off from the surface of the cavity while polishing, and it can be selectively removed without imparting any adverse effect on the substrate, insulating film or the like.

Further, in the second embodiment, the capping film 29 is formed by the coating method; however it is also possible to use the condensation CVD method or the like.

As described above, according to the present invention, a recessed portion made in a substrate is filled with a film forming material, prior to the CMP step. Consequently, the recessed portion is protected from the dusts throughout the CMP step. Therefore, with the present invention, it is possible to prevent the adhesion of dusts to the bottom and side wall of the recessed portion, or the filling of the recessed portion with dusts, while forming a thin film selectively on the bottom surface and side wall of the recessed portion made in a substrate, into a shape corresponding to the shape of the recessed portion.

Further, according to the present invention, the adhesion of dusts to the bottom surface and side wall of a recessed portion, and the filling of the recessed portion with dusts can be prevented, and therefore it is possible to improve the reliability of an element or the yield of products.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:
   forming a first film on an entire surface of a substrate having a recessed portion, including a bottom surface and a side wall of the recessed portion, without completely filling the recessed portion;
   forming a second film made of an insulating material on an entire surface of said first film such that the recessed portion, on the bottom surface and the side wall of which the first film is formed, is completely filled; and
   polishing said first and second films by a chemical-mechanical polishing method such that the substrate is exposed and said first and second films in the recessed portion remain.

2. A method according to claim 1, further comprising the step of removing said second film remaining in the recessed portion, after the polishing step.

3. A method according to claim 1, wherein said second film is substantially consisting of at least one material selected from the group consisting of SOG, resist and polyimide.

4. A method according to claim 1, wherein said first film is a metal film.

5. A method according to claim 1, wherein said second film is formed by a coating method.

6. A method according to claim 1, further comprising the step of forming the recessed portion in one of main surfaces of the substrate, before the first film is formed.

7. A method according to claim 6, wherein the recessed portion forming step includes formation of an insulating film having an opening, on one of main surfaces of said substrate.

8. A method according to claim 7, wherein a polishing rate for the insulating film by the chemical-mechanical polishing method is slower than that of the second film.

9. A method according to claim 1, wherein the recessed portion has a tapered shape narrowing towards the bottom surface.

10. A method of manufacturing a semiconductor device, comprising the steps of:
    forming a recessed portion in one of main surfaces of a substrate;
    forming a metal film on an entire surface of the substrate having the recessed portion, including a bottom surface and a side wall of the recessed portion, without completely filling the recessed portion with said metal film, thus forming a seam portion in an upper section of the recessed portion;
    forming a capping film made of an insulating material on an entire surface of said metal film such that the recessed portion, on the bottom surface and the side wall of which the metal film is formed, is completely filled, and
    polishing said metal film and said capping film by a chemical-mechanical polishing method such that the substrate is exposed and said metal film and said capping film in the recessed portion remain.

11. A method according to claim 10, further comprising the step of removing said capping film remaining in the recessed portion, after the polishing step.

12. A method according to claim 10, wherein said capping film is substantially consisting of at least one material selected from the group consisting of SOG, resist and polyimide.

13. A method according to claim 10, wherein said capping film is formed by a coating method.

14. A method according to claim 10, wherein the recessed portion forming step includes formation of an insulating film having an opening, on one of main surfaces of said substrate.

15. A method according to claim 14, wherein a polishing rate for the insulating film by the chemical-mechanical polishing method is slower than that of the capping film.

16. A method of manufacturing a semiconductor device, comprising the steps of:
    forming a recessed portion in one of main surfaces of a substrate;
    forming a first metal film on an entire surface of the substrate having the recessed portion, including a bottom surface and a side wall of the recessed portion, without completely filling the recessed portion with said metal film;
    forming a capping film on an entire surface of said first metal film such that the recessed portion, on the bottom surface and the side wall of which the metal film is formed, is completely filled;
    polishing said first metal film and said capping film by a chemical-mechanical polishing method such that the substrate is exposed and said first metal film and said capping film in the recessed portion remain;
    removing said capping film remaining in said recessed portion;
    forming a dielectric film on said first metal film in said recessed portion; and
    forming a second metal film on said dielectric film such that said second metal film is electrically insulated from said first metal film.

17. A method according to claim 16, wherein said capping film is made of an insulating material.

18. A method according to claim 16, wherein said capping film is substantially consisting of at least one material selected from the group consisting of SOG, resist and polyimide.

19. A method according to claim 16, wherein said capping film is formed by a coating method.

20. A method according to claim 16, wherein the recessed portion forming step includes formation of an insulating film having an opening, on one of main surfaces of said substrate.

21. A method according to claim 16, wherein a polishing rate for the insulation film by the chemical-mechanical polishing method is slower than that of the capping film.

22. A method according to claim 16, wherein said recessed portion has a tapered shape narrowing towards the bottom surface.

* * * * *